United States Patent [19]

Sato

[11] Patent Number: 4,581,662
[45] Date of Patent: Apr. 8, 1986

[54] POSITION CONTROL APPARATUS FOR CONTROLLING POSITIONS OF ROTARY HEADS WITH RESPECT TO A RECORDING MEDIUM

[75] Inventor: Fumiaki Sato, Yokohama, Japan

[73] Assignee: Victor Company of Japan, Ltd., Japan

[21] Appl. No.: 636,282

[22] Filed: Jul. 31, 1984

[30] Foreign Application Priority Data

Aug. 3, 1983 [JP] Japan ............................. 58-142144

[51] Int. Cl.⁴ ............................................. G11B 5/52
[52] U.S. Cl. ....................................................... 360/75
[58] Field of Search ......................................... 360/75

[56] References Cited

U.S. PATENT DOCUMENTS 4,251,838  2/1981  Saito ..................................... 360/77

FOREIGN PATENT DOCUMENTS 2536893  6/1984  France .
54-73616  6/1979  Japan ..................................... 360/75
58-1844   1/1983  Japan ..................................... 360/75

OTHER PUBLICATIONS

Patent Abstracts of Japan, vol. 7, No. 113, May 18, 1983, (P-197) (1258).
Patent Abstracts of Japan, vol. 6, No. 18, Feb. 2, 1982, (P-100) (896).
Patent Abstracts of Japan, vol. 6, No. 92, May 29, 1982, (P-119) (970).

Primary Examiner—George G. Stellar
Attorney, Agent, or Firm—Andrus, Sceales, Starke & Sawall

[57] ABSTRACT

A position control apparatus for controlling positions of rotary heads with respect to a recording medium, comprises a pulse generating circuit and a head displacing mechanism. A rotary body is mounted with the rotary heads, and two or more rotary heads simultaneously scan over the recording medium at one time. The pulse generating circuit is responsive to a rotation detection pulse signal which is in phase with a rotation of the rotary body, and generates a pulse signal having a phase and pulse width essentially equal to a recording or reproducing time period in which one corresponding rotary head among the rotary heads records or reproduces a signal on or from the recording medium, with respect to each of the rotary heads. The displacing mechanism is provided in correspondence with each of the rotary heads, and separates from a recording surface of the recording medium rotary heads excluding one rotary head which is to carry out a recording or reproduction during essentially the entire time period in which the one rotary head scans over the recording medium, responsive to output pulse signals of the pulse generating circuit.

9 Claims, 12 Drawing Figures

POSITION CONTROL APPARATUS FOR CONTROLLING POSITIONS OF ROTARY HEADS WITH RESPECT TO A RECORDING MEDIUM

BACKGROUND OF THE INVENTION

The present invention generally relates to position control apparatuses for controlling positions of rotary heads with respect to a recording medium, and more particularly to a position control apparatus for controlling relative positions of a plurality of rotary heads with respect to a magnetic surface of a magnetic tape, in a recording and/or reproducing apparatus wherein there exists a time period in which two or more rotary heads among the plurality of rotary heads simultaneously scan over the magnetic tape.

Generally, an existing helical scan type recording and reproducing apparatus (VTR) records a video signal by rotary heads on tracks which are formed obliquely to the longitudinal direction of a magnetic tape upon recording, and reproduces the recorded signal from the tape upon reproduction. Among this type of a helical scan type VTR, there is a known 4-head type VTR in which four rotary heads are equally spaced apart and mounted on a rotary body such as a rotary drum and a rotary plate, so that adjacent rotary heads are spaced apart by 90°. In this 4-head type VTR, two mutually opposing rotary heads have gaps of the same azimuth angle. In addition, the adjacent rotary heads have gaps of mutually different azimuth angles. Certain conditions must be satisfied in order to form a tape pattern on the tape by the 4-head type VTR, so that the tape pattern is identical to a tape pattern which is formed on the tape by the existing VTR (hereinafter referred to as a 2-head type VTR) which carries out the recording and reproduction by use of two rotary heads which are mounted diametrically on a rotary body. One condition which must be satisfied, is to select the azimuth angles of the gaps in the four rotary heads to the same azimuth angles as the gaps in the two rotary heads of the 2-head type VTR. Another condition to be satisfied, is to wrap the tape around the peripheral surface of the rotary body over an angular range of approximately 270°. Still another condition which must be satisfied, is to select the tape traveling speed so that the tape travels by one track pitch during one field period in which one rotary head rotates by 270°.

If the above conditions are satisfied, the length of the tape which is in contact with the peripheral surface of the rotary body in the 4-head type VTR, becomes equal to the length of the tape which is in contact with the peripheral surface of the rotary body in the 2-head type VTR. In addition, the relative linear speed between the tape and the rotary head in the 4-head type VTR becomes equal to the relative linear speed in the 2-head type VTR. As a result, one field of the video signal is successively recorded on one video track by the four rotary heads, and it becomes possible to form a tape pattern on the tape which is identical to the tape pattern formed by the 2-head type VTR. Therefore, a compatible tape pattern is formed so that perfect compatibility can be ensured between the 2-head type VTR and the 4-head type VTR.

Among the four rotary heads in the 4-head type VTR, one field of video signal is recorded on or reproduced from one video track in a time period in which one of the four rotary heads rotates over approximately 270°. During this time period in which one rotary head which is recording or reproducing rotates over approximately 270°, a rotary head which lags the one rotary head by 90° in the rotating direction and a rotary head which lags the one rotary head by 180° in the rotating direction successively scan over a part of the one video track. Accordingly, at the time of the recording, it is necessary to successively switch and supply the video signal to only one of the four rotary heads which is to carry out the recording. Further, at the time of the reproduction, it is necessary to successively switch and obtain a reproduced signal from only one of the four rotary heads which is to carry out the reproduction.

However, in the 4-head type VTR, during a time period in which one of the four rotary heads scans over a non-overlap recording section on the magnetic tape, two of the remaining three rotary heads are also in contact with the magnetic tape. On the other hand, during a time period in which the one rotary head scans over an overlap recording section on the magnetic tape, the remaining three rotary heads are also in contact with the magnetic tape, that is, all the four rotary heads are in contact with the magnetic tape. For this reason, during the time period in which one field of the video signal is recorded on one video track on the magnetic tape, each of the rotary heads other than the rotary head which is carrying out the recording, make contact with the magnetic tape once. In other words, during this time period in which one field of the video signal is recorded, a rotary head other than the rotary head which is carrying out the recording, makes contact with the magnetic tape three times in total. Therefore, during this time period in which one field of the video signal is recorded, the magnetic tape receives an impact every time the rotary head other than the rotary head which is carrying out the recording, starts to make contact with and terminates the contact with the magnetic tape. The magnetic tape receives such impact six times during this time period in which one field of the video signal is recorded. Thus, the magnetic tape vibrates every time it receives the impact, and there is a problem in that a so-called impact error occurs.

According to a known foil bearing theory disclosed in a Japanese Laid-Open Patent Application No. 57-94957 or the like, an air film (layer) thickness h between the magnetic tape and the outer peripheral surface of the rotary body which is mounted with the four rotary heads, can be obtained from the following equation (1), where R is the radius of the rotary body, K is a constant, T is the tape tension, $\mu$ is the coefficient of viscosity of air, and V is the relative speed between the magnetic tape and the rotary head.

$$h = KR(6\mu V/T)^{\frac{2}{3}} \qquad (1)$$

Thus, the air film thickness h is proportional to the radius R of the rotary body. In the case of the 4-head type VTR, the value of the radius R of the rotary body is $\frac{2}{3}$ the value of the radius of the rotary body in the existing 2-head type VTR. Hence, as may be seen from the equation (1), the air film thickness h in the 4-head type VTR is $\frac{2}{3}$ the air film thickness in the existing 2-head type VTR. The four rotary heads project from the outer peripheral surface of the rotary body by quantities (hereinafter referred to as head projecting quantities), and the four rotary heads lift the magnetic tape in the shape of a tent or a tepee. For this reason, when the head projecting quantities of the four rotary heads is maintained the same as the corresponding head projecting quantities in the 2-head type VTR, the magnetic tape receives a greater impact when the rotary head makes contact with the magnetic tape. Further, compared to the 2-head type VTR, the impact on the magnetic tape is also greater when the rotary head terminates contact with the magnetic tape and separates from the magnetic tape, because the rotary head lifts the magnetic tape over a greater distance in the case of the 4-head type VTR. This impact on the magnetic tape causes the magnetic tape to vibrate, and results in a time base deviation (jitter) and color phase deviation.

Accordingly, it is necessary to reduce the head projecting quantities in the 4-head type VTR, compared to the corresponding head projecting quantities in the 2-head type VTR. However, when the head projecting quantities are reduced, the distance between the tip end of the rotary head and the outer peripheral surface of the rotary body becomes shorter. As a result, the serviceable life of the rotary head is shortened because the permissible range in which the rotary head is permitted to wear out to the outer peripheral surface of the rotary body is reduced, and moreover, since the time period in which the rotary head is in contact with the magnetic tape is 3/2 times that of the 2-head type VTR. In addition, even when the head projecting quantities are reduced, the magnetic tape still receives the impact when the rotary head makes contact with and terminates the contact with the magnetic tape.

At the time of the recording in the 4-head type VTR, the crosstalk does not become a problem since the video signal to be recorded is switched and supplied to only one of the four rotary heads which is to carry out the recording. However, at the time of the reproduction, two or three rotary heads other than the one rotary head which is to carry out the reproduction, also scan over the magnetic tape at the same time as when the one rotary head scans over the magnetic tape. Hence, there is a problem in that reproduced signals from those rotary heads other than the one rotary head pass through a rotary transformer which is coupled to the one rotary head, and mix into the reproduced signal from the one rotary head as crosstalk.

SUMMARY OF THE INVENTION

Accordingly, it is a general object of the present invention to provide a novel and useful position control apparatus for controlling positions of rotary heads with respect to a recording medium, in which the problems described heretofore have been eliminated.

Another and more specific object of the present invention is to provide a position control apparatus for controlling positions of rotary heads so that during approximately the entire time period in which one of a plurality of rotary heads scans over a recording medium, the remaining rotary heads assume positions so as not to make contact with the recording medium. According to the apparatus of the present invention, only one rotary head which is to carry out the recording or reproduction scans over the recording medium, and the remaining rotary heads are not in contact with the recording medium while the one rotary head scans over the recording medium. Thus, even when the diameter of a rotary body which is mounted with the plurality of rotary heads is small compared to the diameter of the rotary body in the existing 2-head type VTR and the air film thickness between the recording medium and the outer peripheral surface of the rotary body is small, it is possible to extend the serviceable life of the rotary heads. In addition, at the time of the reproduction in which the one rotary head carries out the reproduction, reproduced signals from the remaining rotary heads will not mix into the reproduced signal from the one rotary head as crosstalk.

Still another object of the present invention is to provide a position control apparatus comprising head displacing means and a pulse generating circuit. During approximately the entire time period in which one of a plurality of rotary heads scans over a recording medium so as to carry out a recording or a reproduction, the head displacing means separates the remaining rotary heads from the recording medium. The pulse generating circuit supplies to the head displacing means pulses each having a sloping leading edge and a sloping trailing edge. According to the apparatus of the present invention, the one rotary head which is to carry out the recording or reproduction, gradually makes contact with the recording medium and gradually separates from the recording medium. As a result, the impact error which occurs due to the vibration of the recording medium when the rotary head makes contact with and terminates the contact with the recording medium, is greatly reduced.

A further object of the present invention is to provide a position control apparatus in which the pulse generating circuit supplies to the head displacing means pulses having levels which vary with a gradual slope, during a time period in which one of a plurality of rotary heads which is to carry out the recording or reproduction scans over one track excluding an overlap recording section on the one track. According to the apparatus of the present invention, the head projecting quantities are gradually reduced, and an optimum recording or reproduction can be carried out with optimum head projecting quantities which are in accordance with the air film thickness.

Another object of the present invention is to provide a position control apparatus comprising head displacing means using piezoelectric elements, oscillator means, and compensating means. The oscillator means uses surface elasticity waves of the piezoelectric elements, to obtain signals having oscillation frequencies which differ according to expanding and contracting quantities of the piezoelectric elements in diretions perpendicular to the surface of the recording medium. The compensating means compensates peak values of output pulses of a pulse generating circuit which supplies control pulses to the head displacing means, based on the output signals of the oscillator means. According to the apparatus of the present invention, it is possible to compensate the hysteresis characteristics of the piezoelectric elements, and compensate for the deterioration in the sensitivity of the piezoelectric elements. Further, it is also possible to compensate the positions of the piezoelectric elements when the piezoelectric elements do not stop at positions where the piezoelectric elements should originally stop after the piezoelectric elements are driven numerous number of times. Therefore, it is possible to obtain predetermined head projecting quantities with a high precision.

Still another object of the present invention is to provide a position control apparatus comprising second oscillator means which uses a surface elasticity wave of an independent piezoelectric element other than the piezoelectric elements which displace the plurality of rotary heads, a frequency converter for obtaining frequency differences between an output signal of the second oscillator means and output signals of first oscillator means which uses the surface elasticity waves of the piezoelectric elements which displace the rotary heads, and compensating means for compensating peak values of output pulses of a pulse generating circuit which supplies control pulses to the head displacing means, based on the output signal frequencies of the frequency converter. According to the apparatus of the present invention, it is possible to always obtain predetermined head projecting quantities which are determined by the control pulses, with a high precision, regardless of the characteristic changes of the piezoelectric elements due to a temperature change. As a result, the displacement of the rotary heads can be controlled with a high precision. Further, when the independent piezoelectric element is mounted on a rotary body which is mounted with the plurality of rotary heads, it is possible to compensate for the characteristic changes of the piezoelectric elements caused by the temperature change, with a higher precision, and it is therefore possible to control the displacement of the rotary heads with an even higher precision.

A further object of the present invention is to provide a position control apparatus in which peak values of control pulses supplied to the head displacing means is changed depending on the hardness of the recording medium, so as to obtain optimum head projecting quantities which are in accordance with the hardness of the recording medium, by taking measures such as reducing the head projecting quantities when the hardness of the recording medium which is being used is softer than a standard hardness.

Other objects and further features of the present invention will be apparent from the following detailed description when read in conjunction with the accompanying drawings.

DETAILED DESCRIPTION

Figure 1:
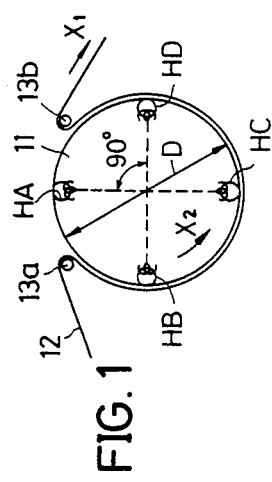
FIG. 1 shows an example of an arrangement of heads in a 4-head type recording and reproducing apparatus which is applied with a position control apparatus according to the present invention.

First, description will be given with respect to the arrangement of heads, the angle over which a magnetic tape is wrapped around the outer peripheral surface of a rotary body, the scanning loci of the heads, and the like, in a 4-head type recording and reproducing apparatus (VTR) which may be applied with a position control apparatus according to the present invention. In FIG. 1, a rotary body 11 which may assume the form of a rotary drum or a rotary plate, for example, has a diameter D. This diameter D of the rotary body 11, is selected to $\frac{2}{3}$ the diameter of the rotary drum in the existing 2-head type VTR. The rotary body 11 is rotated counterclockwise (the direction indicated by an arrow $X_2$) at a rotational speed (45 rps, for example) which is related to the field frequency of the video signal which is to be recorded and reproduced, by a motor (not shown). Recording and reproducing magnetic heads (rotary heads) HA, HB, HC, and HD are equally spaced apart and mounted on the rotary body 11, so that adjacent rotary heads are spaced apart by 90°. The rotary heads HA and HC have gaps of the same azimuth angle, and the rotary heads HB and HD have gaps of the same azimuth angle. The rotary heads HA and HB have gaps of mutually different azimuth angles.

By taking into account the angle required to carry out the overlap recording described before, a magnetic tape 12 is guided by guide poles 13a and 13b and wrapped obliquely around the peripheral surface of the rotary body 11 over an angular range which is greater than 270° and less than 360°. This angular range over which the tape 12 is wrapped around the peripheral surface of the rotary body 11, is selected so as not to interfere with the tape travel, and so that the tape 12 can be loaded automatically. The diameter D of the rotary body 11 is equal to $\frac{2}{3}$ the diameter of the rotary body in the existing 2-head type VTR, and is small. The tape 12 is driven in a state where the tape 12 is pinched between a capstan (not shown) and a pinch roller (not shown), to travel in the direction of an arrow $X_1$. The traveling speed of the tape 12 is selected so that the tape 12 travels by one track pitch while one of the rotary heads HA, HB, HC, and HD rotates by an angle which is slightly larger than 270° at a rotational speed of 45 rps.

Accordingly, the length of the tape 12 which is in contact with the peripheral surface of the rotary body 11, is equal to the length of the tape which is in contact with the peripheral surface of the rotary body in the existing 2-head type VTR. As a result, the loci of video tracks which are formed on the tape 12, is identical to the loci of the video tracks which are formed in the existing 2-head type VTR. In addition, the relative linear speed between the tape and the head, is identical to the relative linear speed obtained in the existing 2-head type VTR. A video signal having a field frequency of 60 Hz (or 59.94 Hz) is successively recorded at a rate of one field in one track, as will be described later on in the specification, and the resulting tape pattern on the tape 12 is identical to the tape pattern which is obtained in the existing 2-head type VTR so as to ensure perfect tape compatibility between the 4-head type VTR which is applied with the system according to the present invention and the existing 2-head type VTR.

When recording or reproducing a video signal having a field frequency of 50 Hz at a rate of one field in one track, it is obvious that the rotary body 11 is rotated at a rotational speed of 37.5 rps.

Figure 2:
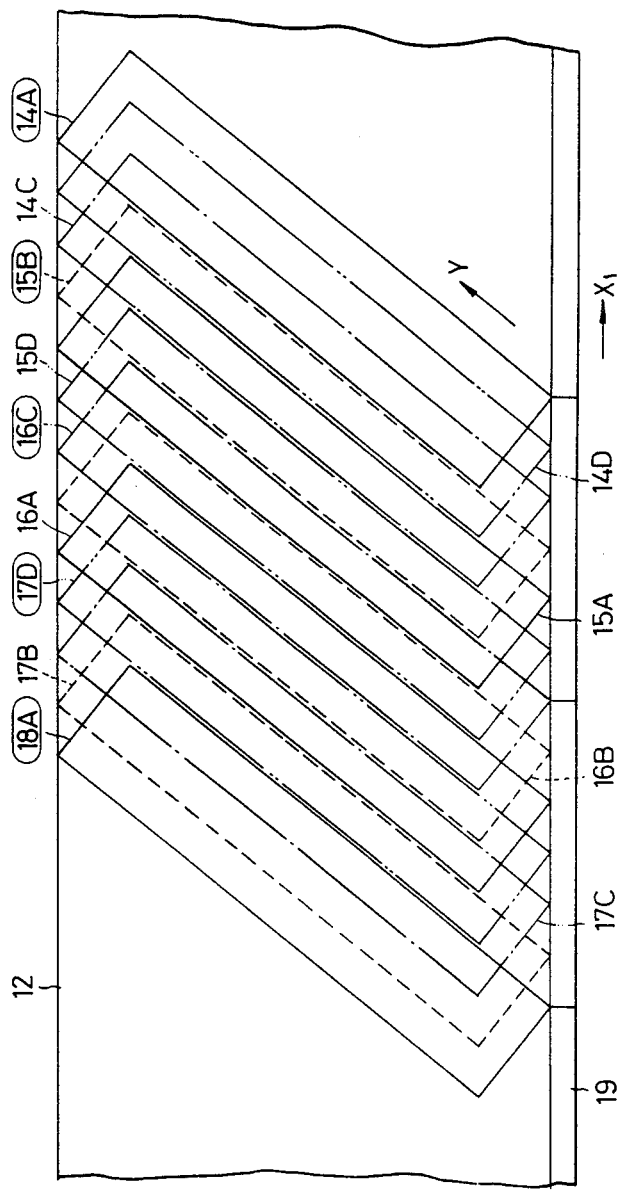
FIG. 2 shows a tape pattern on a tape, illustrating scanning loci of the heads shown in FIG. 1.

The scanning loci of the four rotary heads HA, HB, HC, and HD in the 4-head type VTR described heretofore, are shown in FIG. 2. As clearly seen from FIG. 2, the scanning loci of the four rotary heads HA, HB, HC, and HD are different from the scanning loci of the two rotary heads in the existing 2-head type VTR. If the rotary head HA assumes a location near the guide pole 13a and starts to scan over the tape 12, a scanning locus indicated by a solid line 14A in FIG. 2 begins to be formed. When the rotary head HA scans over approximately ⅓ the scanning locus 14A, the rotary head HD which lags the rotary head HA by 90° with respect to the rotating direction of the rotary body 11 starts to make contact with the tape 12. Further, when the rotary head HA scans over ⅔ the scanning locus 14A, the rotary head HC starts to make contact with the tape 12. At a point when the rotary head HA completes scanning over the scanning locus 14A, the rotary head HB starts to make contact with the tape 12. Accordingly, as the rotary head HA scans over the scanning locus 14A, the rotary head HD scans over a scanning locus indicated by a two-dot chain line 14D in FIG. 2 with a predetermined time lag, and the rotary head HC scans over a scanning locus indicated by a one-dot chain line 14C in FIG. 2 with a further predetermined time lag. The rotary head HB starts to scan over a scanning locus indicated by a broken line 15B at the point when the rotary head HA completes scanning over the scanning locus 14A.

Similarly thereafter, scanning loci 15A, 15D, 16C, 16B, 16A, 17D, 17C, 17B, 18A, . . . are successively formed in this sequence by the rotary heads HA, HB, HC, and HD. In FIG. 2, the track width of each of the tracks are illustrated as being equal to the track pitch, for convenience' sake. In addition, a control track 19 is formed along the longitudinal direction of the tape 12. For example, a control pulse is recorded on this control track 19 with a period which is equal to two fields.

Figure 3:
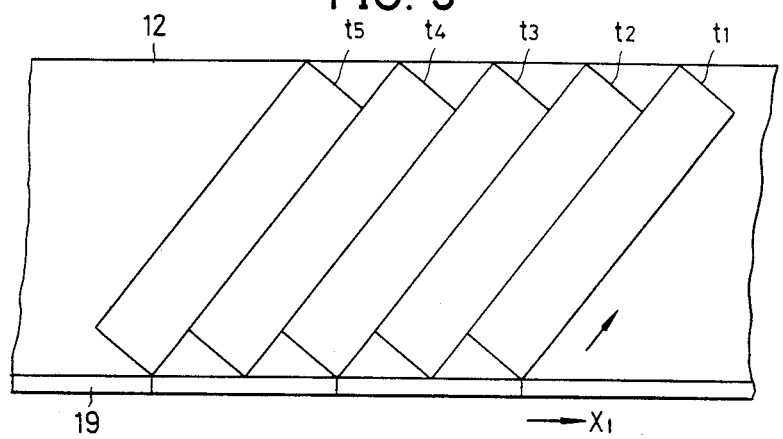
FIG. 3 shows a tape pattern in which the tracks are formed by the heads shown in FIG. 1.

In order to form a tape pattern which is identical to the tape pattern shown in FIG. 3 which is formed by the existing 2-head type VTR, the video signal is only supplied to the rotary heads which are scanning over the scanning loci 14A, 15B, 16C, 17D, 18A, . . . The reference numerals of these scanning loci 14A, 15B, 16C, 17D, 18A, . . . are encircled in FIG. 2. As a result, a track $t_1$ shown in FIG. 3 is formed by the rotary head HA. Similarly, by switching the recording head in a sequence HB→HC→HD→HA→. . . for every period which is approximately equal to one field, video tracks $t_2$, $t_3$, $t_4$, $t_5$, . . . are formed in this sequence.

Hence, during the recording mode of the 4-head type VTR, the video signal must be successively switched and supplied to one of the four rotary heads HA, HB, HC, and HD. Further, during the reproducing mode of the 4-head type VTR, the reproduced signals from the rotary heads HA, HB, HC, and HD must successively be switched so as to obtain only one reproduced signal from one of the rotary heads HA, HB, HC, and HD at one time.

Figure 4:
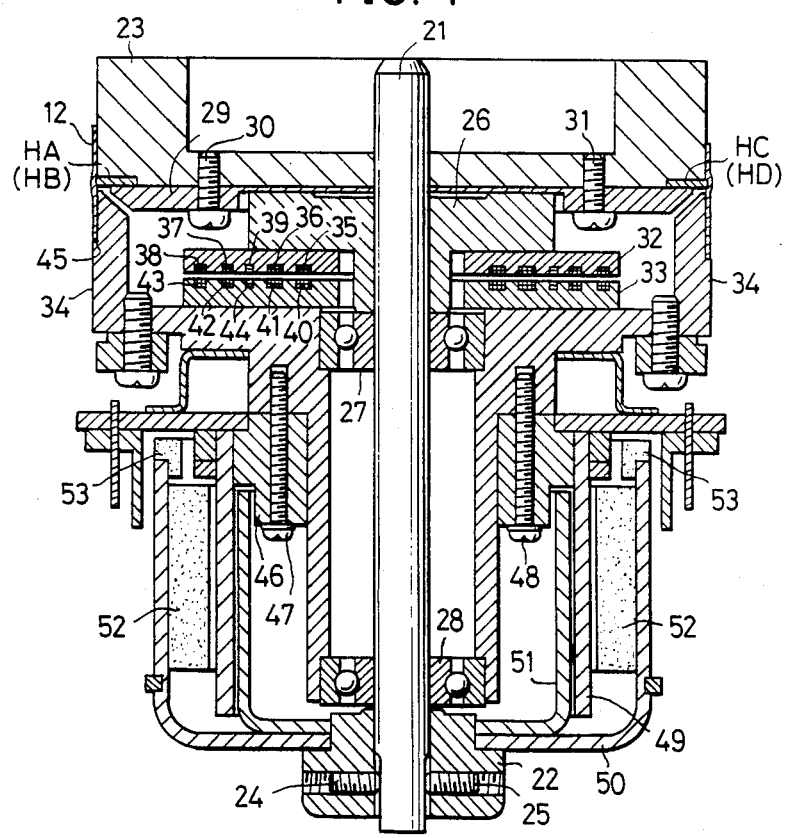
FIG. 4 is a side view in cross section, showing an example of a head rotating structure of the 4-head type recording and reproducing apparatus which is applied with the position control apparatus of the present invention.

Next, description will be given with respect to a head rotating mechanism in conjunction with FIG. 4, by taking as an example a head rotating mechanism disclosed in a U.S. patent application Ser. No. 554,457 filed Nov. 22, 1983, in which the assignee is the same as the assignee of the present application. In FIG. 4, one end of a motor shaft 21 penetrates through a central part of a stopper 22 which is arranged at a bottom part of a motor 20. The other end of the motor shaft 21 is inserted through a central part of a rotary upper drum 23 and fixed to this rotary upper drum 23. This rotary upper drum 23 is an example of the rotary body 11 described before. The stopper 22 is secured to the motor shaft 21 by set screws 24 and 25. A flywheel 26 is fixed to the motor shaft 21 at a central hole thereof, so that a top surface of the flywheel 26 makes contact with a bottom surface of the rotary upper drum 23. The motor shaft 21 is rotatably supported by a bearing 27 which is located below the flywheel 26, and by a bearing 28 which is located above the stopper 22.

A head mount 29 is secured on the bottom surface of the rotary upper drum 23 by set screws 30 and 31. The rotary heads HA (or HB) and HC (or HD) are mounted at diametrical positions on the head mount 29. A disc-shaped rotary core 32 is fixedly mounted onto the flywheel 26. Further, a disc-shaped stationary core 33 is fixedly mounted onto a stationary lower drum 34, so that a top surface of the stationary core 33 opposes a bottom surface of the rotary core 32 with a slight gaps formed between the top surface of the stationary core 33 and the bottom surface of the rotary core 32. A rotary transformer device is made up of the rotary core 32, the stationary core 33, ring-shaped coils 35, 36, 37, and 38 and a first short-circuiting ring 39 which are concentrically arranged on the bottom surface of the rotary core 32, and ring-shaped coils 40, 41, 42, and 43 and a second short-circuiting ring 44 which are concentrically arranged on the top surface of the stationary core 33.

The stationary lower drum 34 comprises therein a part of the motor shaft 21, the flywheel 26, the bearings 27 and 28, the head mount 29, the set screws 30 and 31, the rotary core 32, and the stationary core 33. A tape guiding groove 45 is spirally formed in the outer peripheral surface of the stationary lower drum 34. The magnetic side of the magnetic tape 12 makes contact with the outer peripheral surfaces of both the rotary upper drum 23 and the stationary lower drum 34, in a state where the lower edge of the tape 12 is guided by the tape guiding groove 45. As described before in conjunction with FIG. 1, the tape 12 is spirally wrapped around the outer peripheral surfaces of both the rotary upper drum 23 and the stationary lower drum 34, over an angular range which is greater than 270° and less than 360°.

A stator 46 which surrounds a lower part of the stationary lower drum 34, is secured to the stationary lower drum 34 by set screws 47 and 48. A hollow cylindrical coil 49 is fixedly mounted onto the stator 46. A first rotor 50 and a second rotor 51 respectively have a U-shaped cross section, and therefore has an opening at the upper part thereof. The first rotor 50 has a diameter which is larger than a diameter of the second rotor 51. An upper part of the stopper 22 fits into a center hole in the bottom of the first rotor 50 and also into a center hole in the bottom of the second rotor 51. These first and second rotors 50 and 51 are respectively fixed to the stopper 22. A hollow cylindrical magnet 52 is fixed onto the inner peripheral surface of the first rotor 50. The thickness and the like of the magnet 52 are selected so that the magnet 52 opposes the outer peripheral surface of the coil 49, with a slight gap formed between the inner peripheral surface of the magnet 52 and the outer peripheral surface of the coil 49. In addition, the magnet 52 is magnetized in the horizontal direction in FIG. 4. On the other hand, the outer diameter of the second rotor 51 is selected so that the second rotor 51 opposes the inner peripheral surface of the coil 49, with a slight gap formed between the outer peripheral surface of the second rotor 51 and the inner peripheral surface of the coil 49. A magnet 53 is provided in order to obtain a rotation detection signal which has a frequency in accordance with the rotational speed of the motor shaft 21 and the like.

When a current is applied to the coil 49 in the above motor rotating mechanism, the first and second rotors 50 and 51, the magnet 52, the motor shaft 21, and the stopper 22 respectively rotate unitarily at a rotational speed which is in accordance with the current applied to the coil 49. As a result, the rotary upper drum 23, the head mount 29, the rotary heads HA, HB, HC, and HD, the flywheel 26, and the rotary core 32 respectively rotate unitarily. On the other hand, the stationary core 33, the stationary lower drum 34, the coil 49, and the like, constantly remain stationary.

Figure 5:
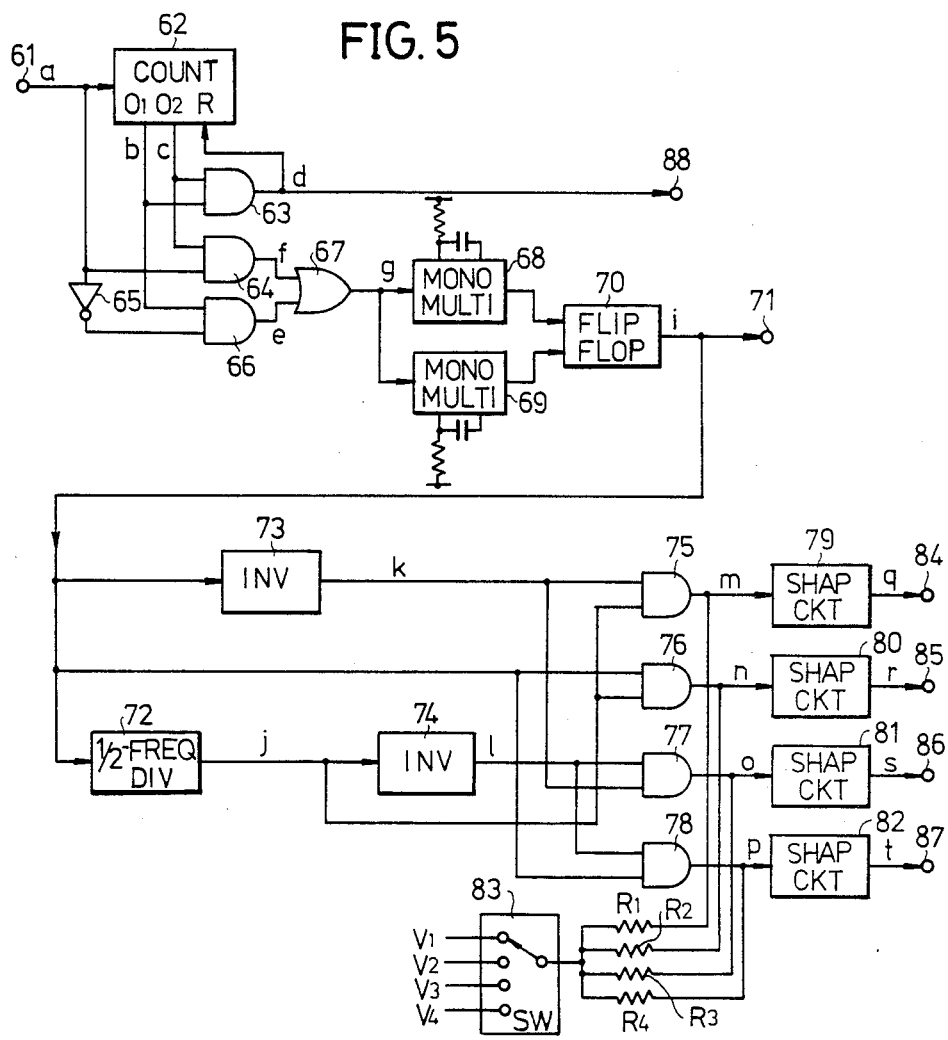
FIG. 5 is a systematic circuit diagram showing an embodiment of an essential part of the position control apparatus according to the present invention.
Figure 7:
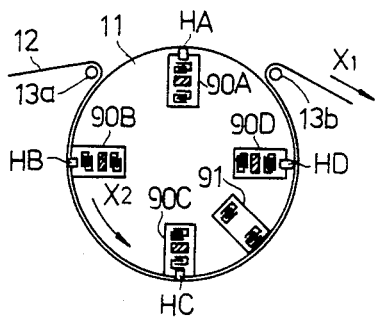
FIG. 7 shows an embodiment of an arrangement of heads in the position control apparatus according to the present invention.

Next, description will be given with respect to an essential circuit and the like of the position control apparatus according to the present invention. In FIG. 5, a rotation detection pulse signal which is in phase with the rotation of the rotary body 11 shown in FIG. 7, is applied to an input terminal 61. As one method of obtaining this rotation detection pulse signal, a light reflecting part may be provided over one-half the rotating section of a rotary part which rotates unitarily with the rotary body 11, and a non-reflecting part may be provided over the remaining half of the rotating section. In this case, a photosensor is arranged at a position opposing the rotary part, and one pulse is produced from the photosensor every time the rotary part undergoes one revolution.

A rotation detection pulse signal a is shown in FIG. 6(A). As shown in FIG. 6(A), the rotation detection pulse signal a is a square wave having a duty cycle of approximately 50%. Thus, the repetition frequency of the rotation detection pulse signal a is equal to 45 Hz when the rotary body 11 rotates at 45 rps. In other words, $\frac{3}{4}$ the period of the rotation detection pulse signal a corresponds to a time period in which the rotary body 11 rotates over 270°, and is equal to a time period of one field of the video signal which is to be recorded and reproduced. The rotation detection pulse signal a is supplied to a counter 62 wherein the pulses are counted. The counter 62 produces a pulse signal b shown in FIG. 6(B) through a first bit output terminal $O_1$, and produces a pulse signal c shown in FIG. 6(C) through a second bit output terminal $O_2$. A pulse signal d shown in FIG. 6(D) which is obtained by passing the output pulse signals b and c of the counter 62 through an AND circuit 63, is applied to a reset terminal R of the counter 62 so as to reset the counter 62. As may be seen from FIGS. 6(A) and 6(D), the repetition frequency of the pulse signal d is equal to 15 Hz. One reset pulse of the pulse signal d is supplied to the counter 62 and to an output terminal 88, every time the rotary body 11 undergoes three revolutions. This means that the reset pulse is produced for every time period of four fields.

Figure 6:
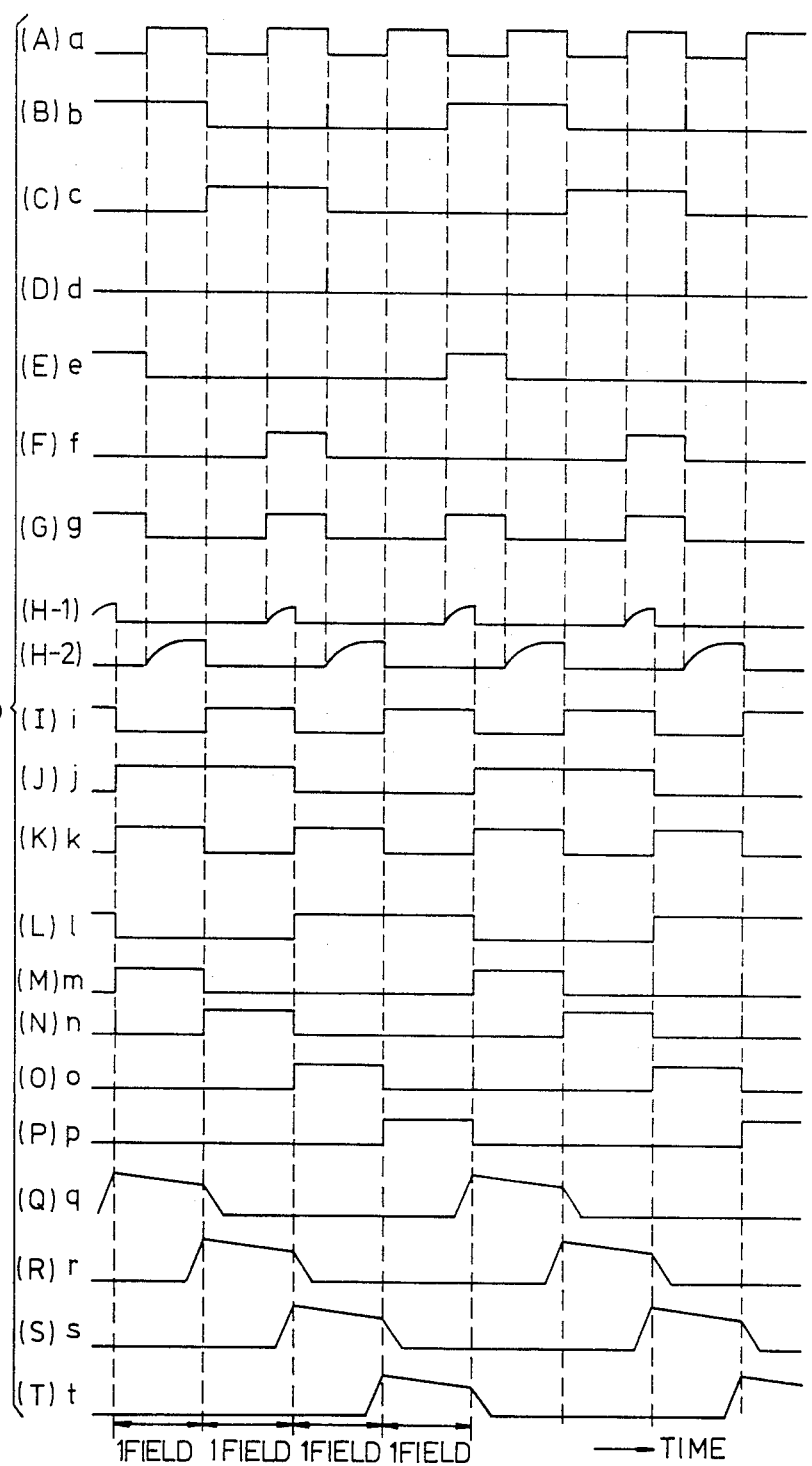
FIGS. 6(A) through 6(T) are graphs showing signal waveforms for explaining the operation of the circuit system shown in FIG. 5.

On the other hand, the rotation detection pulse signal a is supplied to an AND circuit 64 together with the pulse signal c, and a pulse signal f shown in FIG. 6(F) having a repetition frequency of 15 Hz is produced from the AND circuit 64. The rotation detection pulse signal a is also supplied to an AND circuit 66 through an inverter 65, together with the pulse signal b. The AND circuit 66 produces a pulse signal e shown in FIG. 6(E) having a repetition frequency of 15 Hz. The pulse signals e and f are supplied to an OR circuit 67 which produces a pulse signal g shown in FIG. 6(G) having a repetition frequency of 30 Hz. The pulse signal g is supplied to monostable multivibrators 68 and 69. The monostable multivibrator 68 is triggered by a rising edge of the pulse signal g, and the monostable multivibrator 69 is triggered by a falling edge of the pulse signal g. As a result, terminal voltages of respective charging and discharging capacitors of the monostable multivibrators 68 and 69, respectively assume the waveforms shown in FIGS. 6(H-1) and 6(H-2). Output pulse signals of the monostable multivibrators 68 and 69 are applied to a flip-flop 70 as a reset pulse signal and a set pulse signal, respectively. Accordingly, the flip-flop 70 produces a square wave signal i shown in FIG. 6(I). The time constants of the monostable multivibrators 68 and 69 are adjusted so that the output signal i of the flip-flop 70 is a symmetrical square wave having a duty cycle of 50%.

The symmetrical square wave signal i from the flip-flop 70, having the repetition frequency of 30 Hz, is obtained through an output terminal 71 as a head switching signal. The symmetrical square wave signal i is also supplied to a $\frac{1}{2}$-frequency divider 72, an inverter 73, and AND circuits 76 and 78. The frequency divider 72 frequency-divides the symmetrical square wave signal i by $\frac{1}{2}$, and produces a symmetrical square wave sighal j shown in FIG. 6(J) having a repetition frequency of 15 Hz. This symmetrical square wave signal j is supplied to an inverter 74 and AND circuits 75 and 76. Accordingly, a square wave signal k shown in FIG. 6(K) having a reverse phase relationship with the square wave signal i, is obtained from the inverter 73. On the other hand, a square wave signal l shown in FIG. 6(L) having a reverse phase relationship with the square wave signal j, is obtained from the inverter 74.

The AND circuit 75 performs a logical multiplication between the square wave signals j and k, and supplies a pulse signal m shown in FIG. 6(M) to a waveform shaping circuit 79. The AND circuit 76 performs a logical multiplication between the square wave signals i and j, and supplies a pulse signal n shown in FIG. 6(N) to a waveform shaping circuit 80. An AND circuit 77 performs a logical multiplication between the square wave signals k and l, and supplies a pulse signal o shown in FIG. 6(O) to a waveform shaping circuit 81. Further, the AND circuit 78 performs a logical multiplication between the square wave signals i and l, and supplies a pulse signal p shown in FIG. 6(P) to a waveform shaping circuit 82. The pulse widths of the pulse signals m through p correspond to respective recording or reproducing time periods of the rotary heads HA through HD for recording or reproducing one field of the video signal.

A common terminal of a switch 83 is coupled to the open-collector AND circuits 65 through 68, through respective resistors $R_1$ through $R_4$. Four switching terminals of the switch 83, are independently coupled to respective power source voltages $V_1$ through $V_4$. The switch 83 is switched over according to the hardness of the magnetic tape 12, so as to vary the peak values of the pulse signals m through p. Accordingly, as will be described later on in the specification, the quantities that the rotary heads HA through HD project by the operation of piezoelectric bases 90A through 90D, that is, the head projecting quantities, are selected to optimum values which are in accordance with the hardness of the magnetic tape 12. The existing standard type magnetic tape has a thickness of approximately 20 μm. For example, when using a thin type magnetic tape having a thickness of 15 μm, the head projecting quantities must be reduced compared to the head projecting quantities with respect to the standard type magnetic tape. This is because the hardness of the thin type magnetic tape in this case is softer than the hardness of the standard type magnetic tape, and the level of the reproduced signal will be low and unsatisfactory unless the head projecting quantities are reduced. Hence, when carrying out the recording or reproduction with respect to the thin type magnetic tape, the switch 83 is switched over so as to reduce the average head projecting quantity compared to the average head projecting quantity in the case where the recording or reproduction is carried out with respect to the standard type magnetic tape, by adding small voltages to the output pulse signals m through p of the AND circuits 75 through 78.

The waveform shaping circuits 79 through 82 respectively produce pulse signals q through t shown in FIGS. 6(Q) through 6(T), from the pulse signals m through p and from pulse signals which are obtained by delaying the pulse signals m through p by a predetermined delay time. The pulse signals q through t are produced through respective output terminals 84 through 87, as head position control pulse signals. It will be assumed that the pulse widths of the pulse signals m n, o, and p correspond to the respective recording or reproducing time periods of the rotary heads HA, HB, HC, and HD for recording or reproducing one field of the video signal. The pulse signal q produced from the waveform shaping circuit 79, rises with a large slope immediately before a recording or reproducing time period in which the rotary head HA scans over the first overlap recording section of one track, assumes a maximum value at a point when the recording or reproduction of a subsequent one field starts, thereafter decreases with a gradual slope, and falls with with a large slope from a point when the recording or reproduction of one field is completed up to a point immediately after the last overlap recording section of one track is scanned by the rotary head HA, as shown in FIG. 6(Q). The pulse signals r, s, and t produced from the respective waveform shaping circuits 80 through 82, each have a signal waveform similar to the signal waveform of the pulse signal q shown in FIG. 6(Q), as may be seen from FIGS. 6(R), 6(S), and 6(T).

The pulse signals q through t are passed through amplifiers (not shown), and are directly supplied to the piezoelectric bases 90A through 90D comprising piezoelectric elements as shown in FIG. 7, or are indirectly supplied to the piezoelectric bases 90A through 90D through a circuit shown in FIG. 9 which will be described later on in the specification. The pulse signals q through t control the mechanical expansion and contraction of the piezoelectric bases 90A through 90D.

Next, description will be given with respect to the construction of the piezoelectric bases 90A through 90D. In the position control apparatus of the present invention, the arrangement of the rotary heads HA through HD and the head rotating mechanism are basically the same as those of the 4-head type VTR described before. However, as shown in FIG. 7, the rotary heads HA, HB, HC, and HD are mounted on tip ends of the respective piezoelectric bases 90A through 90D. The ends of the piezoelectric bases 90A through 90D opposite to the ends having the respective rotary heads HA through HD, are fixed to the rotary body. The piezoelectric bases 90A through 90D are equally spaced apart by an angular separation of 90°. In FIG. 7, those parts which are the same as those corresponding parts in FIG. 1 are designated by the same reference numerals. As will be described later on in the specification, the rotary body 11 is also mounted with a dummy piezoelectric base 91.

Figure 8A:
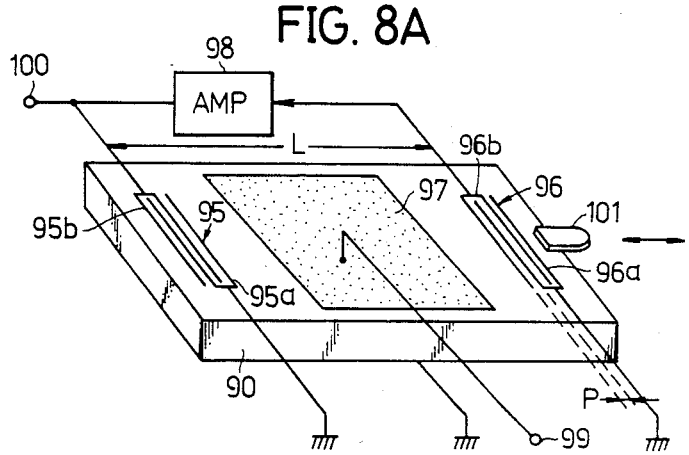
FIGS. 8A and 8B are a perspective view and a side view, respectively showing the construction of a piezoelectric base which constitutes head displacing means.
Figure 8B:
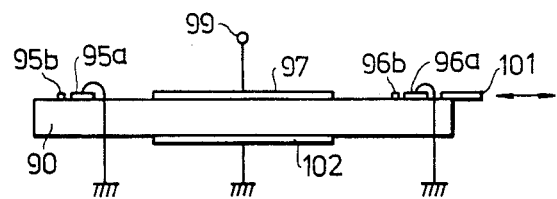

FIGS. 8A and 8B are a perspective view and a side view, respectively showing an embodiment of an arbitrary piezoelectric base among the piezoelectric bases 90A through 90D. In FIGS. 8A and 8B, a piezoelectric base 90 is made up of a piezoelectric element which is shaped in the form of a plate. An electrode part 95 made up of a pair of electrodes 95a and 95b is formed on one end of the piezoelectric base 90, and an electrode part 96 made up of a pair of electrodes 96a and 96b is formed on the other end of the piezoelectric base 90. The electrode parts 95 and 96 have a shape of the teeth of a comb. An electrode 97 having a large area, is formed at the central part on one surface of the piezoelectric base 90. Further, an electrode 102 is formed at the central part on the other surface of the piezoelectric base 90, so as to oppose the electrode 97 through the piezoelectric base 90 as shown in FIG. 8B. A rotary head 101 (that is, one of the rotary heads HA, HB, HC, and HD) is fixed on the other end of the piezoelectric base 90 having the electrode part 96. The electrode 97 receives a head position control pulse signal through an input terminal 99. The electrode 102 is grounded. Responsive to the peak value of the head position control pulse signal, the piezoelectric base 90 expands or contracts in a direction parallel to an imaginary line connecting the electrode parts 95 and 96 in FIGS. 8A and 8B. Accordingly, the rotary head 101 is displaced in the same direction as the expansion or contraction of the piezoelectric base 90, as the piezoelectric base 90 expands or contracts.

The expanding and contracting directions of the piezoelectric base 90 and the displacing directions of the rotary head 101, are in the radial direction of the rotary body 11 as may be seen from FIG. 7. Further, the expanding and contracting directions of the piezoelectric base 90 and the displacing directions of the rotary head 101, are perpendicular to the magnetic surface of the magnetic tape 12 which is wrapped around the outer peripheral surface of the rotary body 11 over an angular range larger than 270° inclusive of the overlap recording part (in the order of 10° before and after the recording or reproducing time period of one field) under the guidance of the guide poles 13a and 13b. Thus, when the piezoelectric base 90 expands, the rotary head 101 projects from the outer peripheral surface of the rotary body 11 towards the magnetic surface of the magnetic tape 12, and makes positive contact with the magnetic tape 12. On the other hand, when the piezoelectric base 90 contracts, the rotary head 101 is drawn back towards the center of the rotary body 11.

There is a known head displacing means which uses two plate shaped piezoelectric elements which have mutually different expanding and contracting directions and are adhered together. One end of this head displacing means is fixed, and the head is mounted on the side surface of the other end of the head displacing means.

However, according to this known head displacing means, the head is displaced along an arc about the fixed end of the head displacing means. For this reason, when the head is displaced, the tip end of the head does not make contact with the magnetic surface of the magnetic tape from a direction perpendicular to the magnetic surface. As a result, the tip end of the head becomes deformed due to wear after repetitive non-perpendicular contacts with the magnetic surface of the magnetic tape. On the other hand, in the present embodiment of the invention, the linear expansion and contraction of the single piezoelectric base 90 are in the horizontal direction. Therefore, the rotary head 101 always makes contact with the magnetic surface of the magnetic tape from a direction perpendicular to the magnetic surface whenever the piezoelectric base 90 expands, and the rotary head 101 will not become deformed due to wear.

For example, the piezoelectric base 90 is mounted at a position so that, when the head position control pulse signal is not applied to the input terminal 99 (that is, when the head projecting quantity is zero), the outermost peripheral position of the rotary body 11 and the tip end position of the rotary head 101 coincide along the axial direction of the rotary body 11.

As shown in FIG. 8A, the electrode 95a of the electrode part on the piezoelectric base 90 is grounded, while the other electrode 95b is coupled to an output terminal 100 of a feedback amplifier 98. On the other hand, the electrode 96a of the electrode part 96 on the piezoelectric base 90 is grounded, while the other electrode 96b is coupled to an input terminal of the amplifier 98. Hence, the surface elasticity wave transmitted from the electrode part 95 to the electrode part 96, is converted into an electrical signal in the electrode part 96. This electrical signal is passed through the amplifier 98 and is produced through the output terminal 100. In addition, this electrical signal is also positively fed back to the electrode part 95. Accordingly, the piezoelectric base 90 shown in FIGS. 8A and 8B not only constitutes a head displacing mechanism for the rotary head 101, but also constitutes an oscillator which uses the surface elasticity wave of the piezoelectric base 90. An oscillation frequency $f_o$ of this oscillator is determined by a ratio of a transmission speed VS of the surface elasticity wave and a wavelength $\lambda_o$ of the surface elasticity wave. For example, when pitches P of the electrode parts 95 and 96 are equal to 15 μm, the wavelength $\lambda_o$ of the surface elasticity wave becomes equal to 30 μm. Since the transmission speed VS of the surface elasticity wave is approximately equal to $3 \times 10^3$ m/sec, the oscillation frequency $f_o$ becomes approximately equal to 100 MHz by calculating the ratio $VS/\lambda_o$.

The oscillation frequency $f_o$ changes depending on the expanding and contacting quanitities of the piezolelectric base 90, that is, depending on a distance L between the electrode parts 95 and 96. By taking into account the diameter D of the rotary body 11, the distance L is set to 10 mm, for example. A sensitivit $K_{SAW}$ of the oscillation frequency change of the piezoelectric base 90 itself, can be described by a formula $K_{SAW}=(\Delta f-f_o)(\Delta L/L)$, where $\Delta f$ is the frequency change and $\Delta L$ is the change in the distance L. Hence, when the piezoelectric base 90 having the sensitivity $K_{SAW}$ of 10 undergoes an expansion or contraction of 1 μm, for example, the frequency change $\Delta f$ becomes equal to 100 kHz from the above formula. Thus, when the head projecting quantity changes by 1 μm, there is a frequency change of 100 kHz. When the head position control pulse signal (voltage) is applied to the input terminal 99 shown in FIGS. 8A and 8B, an electrical field is generated between the electrode parts 95 and 96, and the piezoelectric base 90 becomes distorted by this electrical field. As a result, the piezoelectric base 90 expands or contracts in a direction parallel to an imaginary line connecting the electrodes 95 and 96, and the rotary head 101 is accordingly displaced so as to perpendicularly make contact with the magnetic surface of the magnetic tape 12 or perpendicularly separate from the magnetic surface of the magnetic tape 12. In addition, the output oscillation frequency which is obtained through the output terminal 100 changes, due to the distortion in the piezoelectric base 90.

When the head projecting quantity is controlled by the head position control pulse signal applied to the input terminal 99, based on a piezoelectric constant PC (m/V) of the piezoelectric base 90, the desired head projecting quantity is not always obtainable due to the following reasons. That is, the desired head projecting quantity is not always obtainable due to the hysteresis characteristic of the piezoelectric base 90, the deterioration in the sensitivity of the piezoelectric base 90, and the temperature characteristic of the piezoelectric base 90. Further, the piezoelectric base 90 may not stop at a position where the piezoelectric base 90 should originally stop, after the piezoelectric base 90 is driven numerous number of times, and this may cause the head projecting quantity to change.

Figure 9:
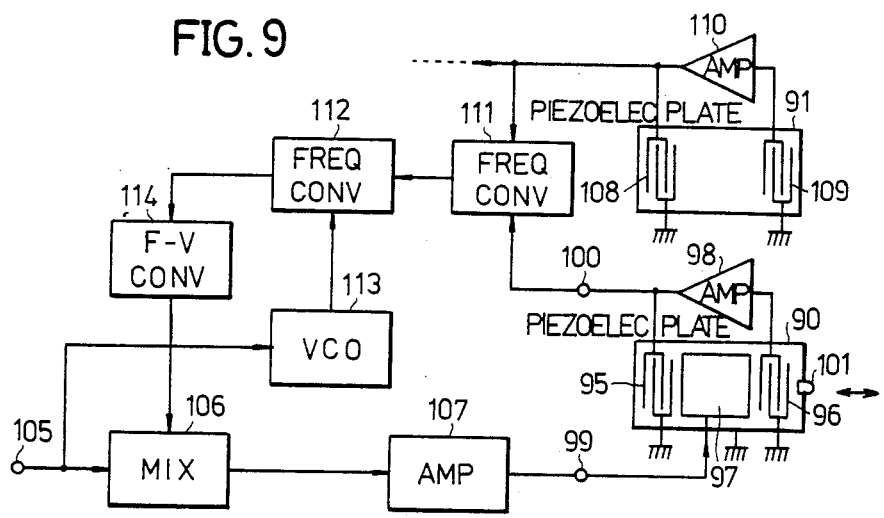
FIG. 9 is a systematic block diagram showing an embodiment of another essential part of the position control apparatus according to the present invention.

Accordingly, in the embodiment shown in FIG. 9, measures are taken so that the desired head projecting quantity is obtainable. In other words, since the surface elasticity wave changes proportionally to the distortion in the piezoelectric base 90, the sensitivity $K_{SAW}(=(\Delta f-f_o)/(\Delta L/L))$ of the oscillation frequency change of the piezoelectric base 90 itself is obtained, and the peak value of the head position control pulse signal applied to the input terminal 99 is compensated based on the oscillation frequency change. In addition, in order to perform a temperature compensation, the dummy piezoelectric base 91 is mounted on the rotary body 11 as shown in FIG. 7, and the temperature compensation is performed by use of the oscillation frequency change of the dummy piezoelectric base 91. The construction of the dummy piezoelectric base 91 is basically the same as the constructions of the other four piezoelectric bases 90A through 90D (90), except in that the electrodes 97 and 102 are not provided on the dummy piezoelectric base 91.

In FIG. 9, those parts which are the same as those corresponding parts in FIGS. 8A and 8B are designated by the same reference numerals. One of the output terminals 84, 85, 86, and 87 is coupled to an input terminal 105. In other words, the circuit shown in FIG. 9 is provided with respect to each of the four piezoelectric bases 90A through 90D, however, the illustration of the other three circuits is omitted in FIG. 9 for convenience' sake. The other three circuits operate similarly as the circuit shown in FIG. 9. As shown in FIG. 7, only a single dummy piezoelectric base 91 is mounted on the rotary body 11. In FIG. 9, the dummy piezoelectric base 91 and an output oscillation frequency signal of an oscillator which comprises a feedback amplifier 110, are commonly used for the other three circuits which are provided with respect to the other three remaining rotary heads.

In FIG. 9, one of the pulse signals q through t which is applied to the input terminal 105, is passed through a mixing circuit 106, an amplifier 107, and the input terminal 99, and is applied to the electrode 97 of the piezoelectric base 90. The piezoelectric base 90 expands or contracts in a predetermined direction as described before, and the rotary head 101 is displaced in a direction perpendicular to the magnetic surface of the magnetic tape (not shown). At the same time, the output oscillation frequency signal of the amplifier 98 is supplied to a frequency converter 111, through the output terminal 100.

On the other hand, electrodes 108 and 109 are formed on the dummy piezoelectric base 91, and the amplifier 110 is coupled between the electrodes 108 and 109. The dummy piezoelectric base 91, the electrodes 108 and 109, and the amplifier 110 constitute an oscillator which uses the surface elasticity wave of the dummy piezoelectric base 91. The output oscillation frequency of the amplifier 110 changes depending on the ambient temperature. The frequency converter performs a frequency conversion to obtain a frequency difference between the output oscillation frequency of the amplifier 110 and the output oscillation frequency of the amplifier 98. The frequency difference is supplied to a frequency converter 112.

A voltage controlled oscillator (VCO) 113 produces a signal having an oscillation frequency which is in accordance with the peak value of one of the pulse signals q through t applied to the input terminal 105. The frequency converter 112 performs a frequency conversion to obtain a frequency difference between the output oscillation frequency signal of the VCO 113 and the output signal of the frequency converter 111, and supplies an output signal to a frequency-to-voltage (F-V) converter 114. The F-V converter 114 produces a voltage having a level in accordance with the frequency of the signal applied thereto, and supplies the voltage to the mixing circuit 106 as a compensation voltage. The mixing circuit 106 mixes this compensation voltage with the pulse signal received through the input terminal 105. The mixing circuit 106 produces the head position control pulse signal which is applied to the electrode 97 through the amplifier 107. The peak value of the head position control pulse signal produced from the mixing circuit 106, is a value which is compensated by taking into account the hysteresis characteristic, the temperature characteristic, the deterioration in the sensitivity, and the like of the piezoelectric base 90. As a result, the piezoelectric base 90 is caused to expand or contract, and the head projecting quantity is always controlled to the desired value with a high precision.

In a case where the dummy piezoelectric base 91 is not provided, the output signal from the output terminal 100 is supplied to the frequency converter 112, so as to compensate the peak value of the head position control pulse signal received through the input terminal 105, similarly as in the case described before. In this case, it is not possible to perform the temperature compensation, however, the error due to the hysteresis characteristic or the like of the piezoelectric base 90 can be positively compensated.

The head position control pulse signal has the signal waveforms shown in FIGS. 6(Q) through 6(T). The head position control pulse signal applied to the input terminal 105 is one of the pulse signals q through t, and the period of the head position control pulse signal is equal to the time period of four fields. Further, the leading and trailing edges of the head position control pulse signal changes with a large slope, while the level of the head position control pulse signal decreases with a gradual slope between the leading and trailing edges. For this reason, responsive to the leading edge of the head position control pulse signal, the rotary head 101 gradually projects from the outer peripheral surface of the rotary body 11 so as to make contact with the magnetic surface of the magnetic tape 12 and perform the recording or reproduction over the overlap recording section. During the time period of one field subsequent to the overlap recording section, the peak value of the head position control pulse signal decreases with a gradual slope as may be seen from FIGS. 6(Q) through 6(T). The head projecting quantity is a maximum at the starting point of the recording or reproduction, and thereafter decreases gradually during the recording section of one field.

Figure 10:
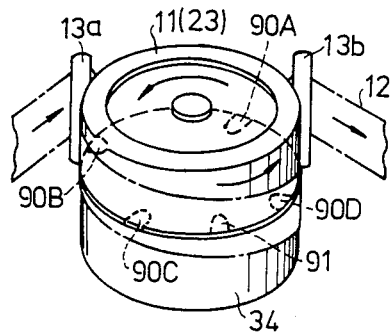
FIG. 10 is a perspective view showing a state where a magnetic tape is wound around the outer peripheral surfaces of a rotary body and a stationary body.
Figure 11:
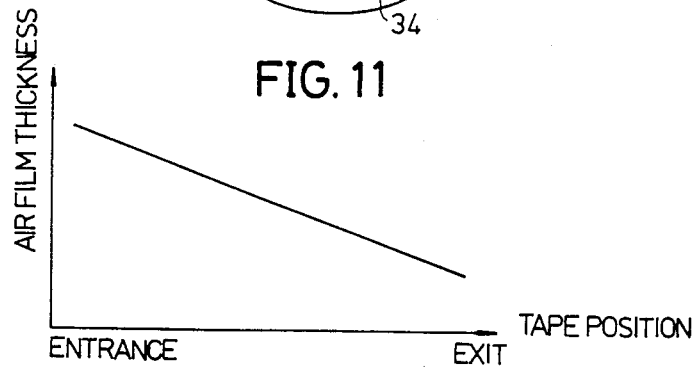
FIG. 11 is a graph showing an example of a change in the air film thickness between the rotary body and the magnetic tape.

As shown in FIG. 10, on the upstream side (entrance side) of the magnetic tape 12 with respect to the rotary body 11, the area over which the magnetic tape 12 is in contact with the rotary body 11 (rotary upper drum 23) is greater than the area over which the magnetic tape 12 is in contact with the stationary drum 34. On the other hand, on the downstream side (exit side) of the magnetic tape 12 with respect to the rotary body 11, the area over which the magnetic tape 12 is in contact with the rotary body 11 is smaller than the area over which the magnetic tape 12 is in contact with the stationary drum 34. Thus, as shown in FIG. 11, the air film thickness decreases as the magnetic tape 12 moves from the entrance side towards the exit side with respect to the rotary body 11. The reproduced output can be kept constant by gradually reducing the head projecting quantity from the entrance side towards the exit side with respect to the rotary body 11, so that the rotary head makes contact with the magnetic tape with the same contact pressure on the entrance side and the exit side. This is realized in the present invention, that is, the head projecting quantity is gradually reduced from the entrance side towards the exit side with respect to the rotary body 11, since the peak value of the head position control pulse signal decreases with a gradual slope between the leading and trailing edges thereof when the recording or reproduction is carried out over the recording section of one field, as described before.

Further, as described before, the trailing edge of the head position control pulse decreases with a large slope, as shown in FIGS. 6(Q) through 6(T). Thus, as the rotary head 101 carries out the recording or reproduction over the overlap recording section subsequent to the recording section of one field, the head projecting quantity gradually decreases, and the rotary head 101 separates from the magnetic tape 12 in a vicinity of the guide pole 13b which is located on the exit side. In other words, the rotary head 101 is displaced and controlled so that the rotary head 101 gradually makes contact with the magnetic surface of the magnetic tape 12, and gradually separates from the magnetic surface. Therefore, the impact error described before, is greatly reduced according to the present invention.

In addition, during the time period in which one of the rotary heads HA through HD is carrying out the recording or reproduction over the recording section of one field excluding the overlap recording section, the peak values of the head position control pulse signals which are used to control the three remaining rotary heads are zero, as may be seen from FIGS. 6(Q) through 6(T). Accordingly, the head projecting quantities of the three remaining rotary heads which are not carrying out the recording or reproduction, are controlled to zero. As a result, only the one rotary head which is carrying out the recording or reproduction is in contact with the magnetic surface of the magnetic tape 12, and the remaining three rotary heads will not make contact with the magnetic surface of the magnetic tape 12. Hence, the serviceable life of the rotary heads HA through HD can be extended. Moreover, it is possible to prevent the crosstalk from the adjacent track from becoming mixed into the reproduced signal through the rotary transformer.

A rotary head may be mounted on the dummy piezoelectric base 91. Further, the dummy piezoelectric base 91 may be mounted at a location other than on the rotary body 11. However, a more accurate temperature compensation can be performed if the ambient conditions of the dummy piezoelectric base 91 are the same as the ambient conditions of the piezoelectric bases 90A through 90D. For this reason, it is preferable to mount the dummy piezoelectric base 91 on the same rotary body 11 on which the piezoelectric bases 90A through 90D are mounted. In addition, the position control apparatus according to the present invention is not limited to the embodiments described heretofore, and the main object of the present invention may be achieved if the apparatus comprises means for controlling the positions of the rotary heads so that during a large portion of the time period in which one rotary head carries out the recording or reproduction (that is, the time period in which one field excluding the overlap recording section is scanned), the remaining three rotary heads are displaced so as not to make contact with the magnetic surface of the magnetic tape 12. The means for compensating the hysteresis characteristic and the temperature characteristic of the piezoelectric bases 90A through 90D, the means for reducing the impact error, and the means for controlling the head projecting quantity according to the hardness of the magnetic tape 12, are not essential to the present invention.

The application of the position control apparatus according to the present invention is not limited to the 4-head type VTR described heretofore. The position control apparatus according to the present invention may be applied to any recording and reproducing apparatus in which a magnetic tape is wrapped around the outer peripheral surface of a rotary body over a predetermined angular range which is greater than 180°, two or more rotary heads among a plurality of rotary heads mounted on the rotary body simultaneously scan over the magnetic tape at one time, and the recording and reproduction are carried out by use of the plurality of rotary heads. In addition, the head projecting quantities may be controlled by using output oscillation frequency signals of oscillators which use surface elasticity waves of piezoelectric bases.

Further, the present invention is not limited to these embodiments, but various variations and modifications may be made without departing from the scope of the present invention.

What is claimed is:

1. A position control apparatus for controlling positions of rotary heads with respect to a recording medium in a recording and/or reproducing apparatus, said recording and reproducing apparatus comprising a rotary body on which a recording medium in the form of a tape is wrapped around an outer peripheral surface of said rotary body over a predetermined angular range which is greater than or equal to 180°, a plurality of rotary heads mounted in a rotating plane of said rotary body for recording and/or reproducing signals on and/or from said recording medium as said recording medium moves, two or more rotary heads among said plurality of rotary heads simultaneously scanning over said recording medium at one time, said position control apparatus comprising:

a pulse generating circuit responsive to a rotation detection pulse signal which is in phase with a rotation of said rotary body, for generating a pulse signal having a phase and pulse width essentially equal to a recording or reproducing time period in which one corresponding rotary head among said plurality of rotary heads records or reproduces a signal on or from said recording medium, with respect to each of said plurality of rotary heads; and head displacing means provided in correspondence with each of said plurality of rotary heads, for separating from a recording surface of said recording medium rotary heads excluding one rotary head which is to carry out a recording or reproduction during essentially the entire time period in which said one rotary head scans over said recording medium, responsive to output pulse signals of said pulse generating circuit.

2. A position control apparatus as claimed in claim 1 in which said pulse generating circuit generates a pulse signal having a sloping leading edge and a sloping trailing edge, only with respect to said head displacing means which displaces said one rotary head which is to carry out the recording or reproduction, so that said one rotary head gradually makes contact with the recording surface of said recording medium and gradually separates from the recording surface of said recording medium.

3. A position control apparatus as claimed in claim 1 in which said pulse generating circuit generates a pulse signal having a level which gradually slopes between leading and trailing edges thereof, only with respect to said head displacing means which displaces said one rotary head which is to carry out the recording or reproduction, so that said one rotary head makes contact with the recording surface of said recording medium with a contact pressure which gradually decreases during the time period in which said one rotary head scans over said recording medium.

4. A position control apparatus as claimed in claim 1 in which said pulse generating circuit comprises means for generating pulse signals having different peak values depending on the hardness of said recording medium.

5. A position control apparatus for controlling positions of rotary heads with respect to a recording medium in a recording and/or reproducing apparatus, said recording and reproducing apparatus comprising a rotary body on which a recording medium in the form of a tape is wrapped arpund an outer peripheral surface of said rotary body over a predetermined angular range which is greater than or equal to 180°, a plurality of rotary heads mounted in a rotating plane of said rotary body for recording and/or reproducing signals on and/or from said recording medium as said recording medium moves, two or more rotary heads among said plurality of rotary heads simultaneously scanning over said recording medium at one time, said position control apparatus comprising:

a pulse generating circuit responsive to a rotation detection pulse signal which is in phase with a rotation of said rotary body, for generating a pulse signal having a phase and pulse width essentially equal to a recording or reproducing time period in which one corresponding rotary head among said plurality of rotary heads records or reproduces a signal on or from said recording medium, with respect to each of said plurality of rotary heads;

head displacing means using piezoelectric elements and provided in correspondence with each of said plurality of rotary heads, for separating from a recording surface of said recording medium rotary heads excluding one rotary head which is to carry out a recording or reproduction during essentially the entire time period in which said one rotary head scans over said recording medium, responsive to output pulse signals of said pulse generating circuit, said piezoelectric elements expanding and contracting in a direction perpendicular to the recording surface of said recording medium responsive to peak values of the output pulse signals of said pulse generating circuit;

oscillator means using surface elasticity waves of said piezoelectric elements, for producing signals having different oscillation frequencies responsive to expanding and contracting quantities of said piezoelectric elements; and compensating means for compensating the peak values of the output pulse signals of said pulse generating circuit responsive to output signals of said oscillator means.

6. A position control apparatus as claimed in claim 5 in which said compensating means comprises variable frequency oscillator means for generating signals having repetition frequencies responsive to the peak values of the output pulse signals of said pulse generating circuit, means for producing compensation signals having levels responsive to respective frequency differences between output signal frequencies of said oscillator means and output signal frequencies of said variable frequency oscillator means, and mixing means for adding said compensation signals to the output pulse signals of said pulse generating circuit.

7. A position control apparatus for controlling positions of rotary heads with respect to a recording medium in a recording and/or reproducing apparatus, said recording and reproducing apparatus comprising a rotary body on which a recording medium in the form of a tape is wrapped around an outer peripheral surface of said rotory body over a predetermined angular range which is greater than or equal to 180°, a plurality of rotary heads mounted in a rotating plane of said rotary body for recording and/or reproducing signals on and/or from said recording medium as said recording medium moves, two or more rotary heads among said plurality of rotary heads simultaneously scanning over said recording medium at one time, said position control apparatus comprising:

a pulse generating circuit responsive to a rotation detection pulse signal which is in phase with a rotation of said rotary body, for generating a pulse signal having a phase and pulse width essentially equal to a recording or reproducing time period in which one corresponding rotary head among said plurality of rotary heads records or reproduces a signal on or from said recording medium, with respect to each of said plurality of rotary heads;

head displacing means using first piezoelectric elements and provided in correspondence with each of said plurality of rotary heads, for separating from a recording surface of said recording medium rotary heads excluding one rotary head which is to carry out a recording or reproduction during essentially the entire time period in which said one rotary head scans over said recording medium, responsive to output pulse signals of said pulse generating circuit, said first piezoelectric elements expanding and contracting in a direction perpendicular to the recording surface of said recording medium responsive to peak values of the output pulse signals of said pulse generating circuit;

first oscillator means using surface elasticity waves of said first piezoelectric elements, for producing signals having different oscillation frequencies responsive to expanding and contracting quantities of said first piezoelectric elements;

second oscillator means using a surface elasticity wave of an independent second piezoelectric element;

frequency converter means for obtaining respective frequency differences between an output signal frequency of said second oscillator means and output signal frequencies of said first oscillator means; and compensating means for compensating the peak values of the output pulse signals of said pulse generating circuit responsive to output signal frequencies of said frequency converter means.

8. A position control apparatus as claimed in claim 7 in which said second piezoelectric element is mounted on the rotating plane of said rotary body.

9. A position control apparatus as claimed in claim 7 in which said compensating means comprises variable frequency oscillator means for generating signals having repetition frequencies responsive to the peak values of the output pulse signals of said pulse generating circuit, means for producing compensation signals having levels responsive to respective frequency differences between output signal frequencies of said frequency converter means and output signal frequencies of said variable frequency oscillator means, and mixing means for adding said compensation signals to the output pulse signals of said pulse generating circuit.

* * * * *